United States Patent
Lu et al.

(10) Patent No.: US 11,335,726 B2
(45) Date of Patent: May 17, 2022

(54) LENS STRUCTURE CONFIGURED TO INCREASE QUANTUM EFFICIENCY OF IMAGE SENSOR

(71) Applicant: Taiwan Semiconductor Manufacturing Co., Ltd., Hsin-Chu (TW)

(72) Inventors: Jiech-Fun Lu, Madou Township (TW); Chun-Tsung Kuo, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 46 days.

(21) Appl. No.: 16/804,208

(22) Filed: Feb. 28, 2020

(65) Prior Publication Data
US 2021/0134875 A1    May 6, 2021

Related U.S. Application Data

(60) Provisional application No. 62/928,559, filed on Oct. 31, 2019.

(51) Int. Cl.
*H01L 27/146* (2006.01)
*H04N 5/341* (2011.01)

(52) U.S. Cl.
CPC .... *H01L 27/14685* (2013.01); *H01L 27/1461* (2013.01); *H01L 27/14627* (2013.01); *H04N 5/341* (2013.01)

(58) Field of Classification Search
None
See application file for complete search history.

(56) References Cited

U.S. PATENT DOCUMENTS 9,985,072 B1 *   5/2018   Wen ............... H01L 27/14609
2007/0264424 A1  11/2007  Wang
(Continued)

FOREIGN PATENT DOCUMENTS

KR    20170106251 A    9/2017

OTHER PUBLICATIONS

Nanyi Book Company Enterprise Co. "Convex Lens Imaging." The date of publication is unknown. Retrieved online on Feb. 28, 2020 from http://www.nani.com.tw/nani/jlearn/natu/multimedia/m3/m3_9.jsp.

(Continued)

*Primary Examiner* — Ali Naraghi
(74) *Attorney, Agent, or Firm* — Eschweiler & Potashnik, LLC

(57) ABSTRACT

Various embodiments of the present disclosure are directed towards an image sensor having a substrate including a plurality of sidewalls that define a plurality of protrusions along a first side of the substrate. The substrate has a first index of refraction. A photodetector is disposed within the substrate and underlying the plurality of protrusions. A plurality of micro-lenses overlying the first side of the substrate. The micro-lenses have a second index of refraction that is less than the first index of refraction. The micro-lenses are respectively disposed laterally between and directly contact an adjacent pair of protrusions in the plurality of protrusions. Further, the micro-lenses respectively comprise a convex upper surface.

20 Claims, 7 Drawing Sheets

(56) References Cited

U.S. PATENT DOCUMENTS

| | | | |
|---|---|---|---|
| 2015/0287761 A1* | 10/2015 | Huang | H01L 27/14625 |
| | | | 257/432 |
| 2018/0350853 A1* | 12/2018 | Huang | H01L 31/102 |
| 2019/0096930 A1* | 3/2019 | Chuang | H01L 27/1463 |
| 2019/0103437 A1* | 4/2019 | Su | H01L 27/1464 |
| 2019/0148437 A1 | 5/2019 | Cheng et al. | |
| 2019/0148570 A1* | 5/2019 | Wu | H01L 31/02363 |
| | | | 257/187 |
| 2019/0165026 A1* | 5/2019 | Kuo | H01L 27/14685 |
| 2020/0027915 A1* | 1/2020 | Hsieh | H01L 27/1462 |

OTHER PUBLICATIONS

Tagliaferi, Chiarina. "Black Silicon Solar Cells That Also Absorb Infrared Radiation." The date of publication is unknown. Retrieved online on Feb. 28, 2020 from http://www.fotovoltaicosulweb.it/guida/celle-solari-al-silicio-nero-che-assorbono-anche-la-radiazione-infrarossa.html.

Wikipedia.org "Lenses." Published on Mar. 8, 2018.

Borrero Visba, Joaquin E. "Chapter 36—Lenses. PowerPoint presentation." Published in 2010. An English translation of each slide is provided on the 1st page of the document.

Yi, Zheng. "50-Year-Old Aunt Suffers From "Net Detachment", Which is Caused by High Myopia." Published on Feb. 27, 2017.

\* cited by examiner

LENS STRUCTURE CONFIGURED TO INCREASE QUANTUM EFFICIENCY OF IMAGE SENSOR

REFERENCE TO RELATED APPLICATION

This Application claims the benefit of U.S. Provisional Application No. 62/928,559, filed on Oct. 31, 2019, the contents of which are hereby incorporated by reference in their entirety.

BACKGROUND

Many modern day electronic devices (e.g., digital cameras, optical imaging devices, etc.) comprise image sensors. Image sensors convert optical images to digital data that may be represented as digital images. An image sensor includes an array of pixel sensors, which are unit devices for the conversion of an optical image into digital data. Some types of pixel sensors include charge-coupled device (CCD) image sensors and complementary metal-oxide-semiconductor (CMOS) image sensors (CIS). Compared to CCD pixel sensors, CIS are favored due to low power consumption, small size, fast data processing, a direct output of data, and low manufacturing cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
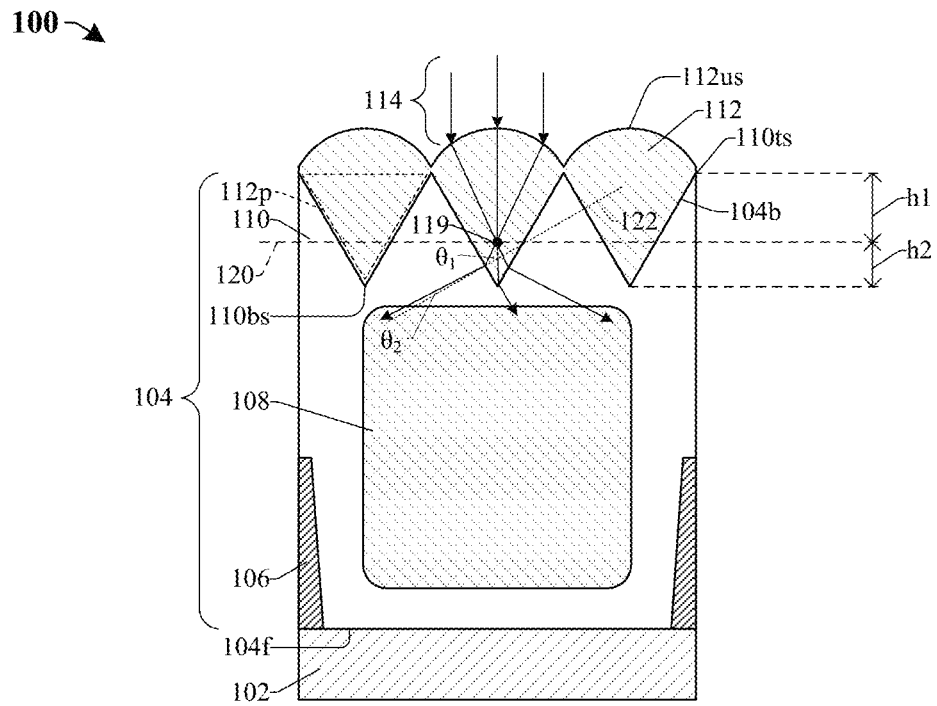
FIG. 1 illustrates a cross-sectional view of some embodiments of an image sensor including a substrate with a plurality of protrusions, and a plurality of micro-lenses disposed over and spaced laterally between the protrusions.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

CMOS image sensors (CIS) typically comprise an array of pixel regions, which respectively have a photodetector arranged within a semiconductor substrate. Light filters (e.g., color filters, infrared (IR) filters, etc.) are arranged over the photodetectors and are configured to filter incident light provided to different photodetectors within the CIS. Upon receiving light, the photodetectors are configured to generate electric signals corresponding to the received light. The electric signals from the photodetectors can be processed by a signal processing unit to determine an image captured by the CIS. Quantum efficiency (QE) is a ratio of the numbers of photons that contribute to an electric signal generated by a photodetector within a pixel region to the number of photons incident on the pixel region. It has been appreciated that the QE of a CIS can be improved with on-chip absorption enhancement structures.

An absorption enhancement structure may include a plurality of protrusions arranged along a surface of the semiconductor substrate. The absorption enhancement structure can increase absorption by decreasing the reflection of incident radiation. Further, a passivation layer overlies the absorption enhancement structure and fills recesses between the plurality of protrusions. During formation of the passivation layer over the absorption enhancement structure, an anti-reflective coating (ARC) layer is formed over the passivation layer. Subsequently, the ARC layer and the passivation layer are etched at a same rate until a top surface of the protrusions is reached, such that the passivation layer has a substantially flat top surface. However, as incident radiation passes through the substantially flat top surface of the passivation layer to the plurality of protrusions, it may be reflected off a sidewall of a protrusion away from an underlying photodetector. This may be because the incident light travels along a path that is approximately perpendicular to the substantially flat top surface of the passivation layer and may not be focused towards the underlying photodetector. The reflected radiation may be directed towards an adjacent underlying photodetector, thereby causing cross-talk between photodetectors and/or reflected away from the pixel region. Further, the reflected radiation may be directed away from the semiconductor substrate, thereby decreasing incident radiation disposed upon the underlying photodetector. This in part may decreasing a QE of the underlying photodetector.

Accordingly, some embodiments of the present disclosure are directed towards an image sensor including a substrate with a plurality of protrusions, and a plurality of micro-lenses, each having a convex upper surface, overlying and spaced laterally between the protrusions. For example, during fabrication of the image sensor, a photodetector is formed in a substrate and a plurality of protrusions is formed along a back-side surface of the substrate. A passivation layer is formed over the plurality of protrusions, such that the passivation layer fills a plurality of recesses disposed between the plurality of protrusions. An ARC layer is formed over the passivation layer and a partial etch is performed on the ARC layer until an upper surface of the passivation layer is reached, thereby leaving at least a portion of the ARC layer over the passivation layer. Further, one or more high selectivity etch processes are performed on the ARC layer and passivation layer, such that the passivation layer is etched at a higher rate than the ARC layer. This, in part, defines a plurality of micro-lenses over the plurality of protrusions, such that a micro-lens is disposed between each adjacent pair of protrusions and each micro-lens has a convex upper surface. By virtue of the convex upper surface, the micro-lenses are configured to focus incident radiation towards a focus point between each adjacent pair of protrusions, thereby decreasing reflection of incident radiation and increasing incident radiation directed towards the photodetector. This, in turn, increases a QE of the image sensor.

FIG. 1 illustrates a cross-sectional view of some embodiments of an image sensor 100 including a substrate 104 with a plurality of protrusions 110, and a plurality of micro-lenses 112 disposed over and spaced laterally between the protrusions 110.

The image sensor 100 includes an interconnect structure 102 disposed along a front-side 104f of the substrate 104. In some embodiments, the substrate 104 comprises any semiconductor body (e.g., bulk silicon, epitaxial silicon, another suitable semiconductor material, or the like) and/or has a first doping type (e.g., p-type doping). A photodetector 108 is disposed within the substrate 104 and is configured to convert incident electromagnetic radiation 114 (e.g., photons) into electrical signals (i.e., to generate electron-hole pairs from the incident electromagnetic radiation 114). The photodetector 108 comprises a second doping type (e.g., n-type doping) opposite the first doping type. In some embodiments, the first doping type is n-type and the second doping type is p-type, or vice versa. In further embodiments, the photodetector 108 may be configured as and/or comprise a photodiode. An isolation structure 106 is disposed within the substrate 104 and extends from the front-side 104f of the substrate 104 to a point above the front-side 104f. In some embodiments, the isolation structure 106 may comprise a dielectric material (e.g., silicon dioxide, silicon nitride, silicon carbide, etc.) and/or may be configured as a shallow trench isolation (STI) structure, deep trench isolation (DTI) structure, or another suitable isolation structure.

A back-side 104b of the substrate 104 is disposed opposite the front-side 104f of the substrate 104. The back-side 104b of the substrate 104 comprises a non-planar surface defining a plurality of protrusions 110 arranged in a periodic pattern. Thus, the protrusions 110 may be or comprise a same material (e.g., silicon) as the substrate 104. The plurality of protrusions 110 are laterally separated from one another by recesses within the back-side 104b of the substrate 104. The plurality of protrusions 110 each comprise opposing angled sidewalls. The protrusions 110 of the substrate 104 are configured, for example, to increase a light receiving surface area for the incident electromagnetic radiation 114 disposed upon the photodetector 108. This, in part, increases a sensitivity and/or a quantum efficiency (QE) of the image sensor 100.

Further, a plurality of micro-lenses 112 are disposed within the recesses laterally between the protrusions 110, such that one of the micro-lenses 112 is disposed laterally between a corresponding pair of protrusions 110. In some embodiments, the micro-lenses 112 may, for example, respectively be or comprise a dielectric material (e.g., silicon dioxide) and/or may have a first index of refraction. It will be appreciated that other materials for the micro-lenses 112 are also within the scope of the disclosure. In further embodiments, the substrate 104 comprises a semiconductor material (e.g., silicon) different than the dielectric material of the micro-lenses 112 and/or has a second index of refraction different from the first index of refraction. It will be appreciated that other materials for the substrate 104 are also within the scope of the disclosure. In some embodiments, the second index of refraction is greater than the first index of refraction. In some embodiments, the micro-lenses 112 respectively comprise a micro-lens protrusion 112p that conforms to sidewalls of the protrusions 110 and fill the recesses between the protrusions 110. In further embodiments, the micro-lenses 112 directly contact the protrusions 110. Each of the micro-lenses 112 comprise a convex upper surface 112us that is curved and/or rounded outward in a direction away from the protrusions 110. As illustrated in FIG. 1, the incident electromagnetic radiation 114 (as illustrated by arrows) enters the micro-lenses 112 through the convex upper surface 112us. By virtue of the convex upper surface 112us of each micro-lens 112, the incident electromagnetic radiation 114 is bent significantly and/or angled towards a focal point 119 underlying the convex upper surface 112us. The focal point 119 is disposed along a focal plane 120 that is vertically separated from a top surface 110ts of the protrusions 110 by a first height h1 and that is vertically separated from a bottom surface 110bs of the protrusions by a second height h2. In some embodiments, the first height h1 is greater than the second height h2. In such embodiments, this mitigates the incident electromagnetic radiation 114 from reflecting off a sidewall of the protrusions 110 in a direction away from the photodetector 108. In further embodiments, by virtue of the second height h2 being less than the first height h1, the angles of incidence $\theta_1$ of the incident electromagnetic radiation 114 upon a sidewall of the protrusions 110 are significantly small, such that light is not reflected away from the substrate 104. Other electromagnetic radiation (not shown) that are not parallel to the incident electromagnetic radiation 114 and that enter the micro-lenses 112 refract as described above and intersect other focal points along the focal plane 120.

Further, after the incident electromagnetic radiation 114 is angled towards the focal point 119 it may traverse sidewalls of the protrusions 110. Since, in some embodiments, the micro-lenses 112 have the first index of refraction that is less than the second index of refraction of the underlying protrusions 110, the incident electromagnetic radiation 114 will refract away from the corresponding normal axes 122 towards the photodetector 108. In other words, the lower refractive index of the micro-lenses 112 relative to the protrusions 110 causes the incident electromagnetic radiation 114 to have an angle of refraction $\theta_2$ that is less than a corresponding angle of incidence $\theta_1$, thereby focusing the incident electromagnetic radiation 114 towards the photodetector 108. This increases absorption of the incident electromagnetic radiation 114 by the substrate 104 (e.g., by reducing a reflection of the incident electromagnetic radiation 114 away from the protrusions 110). Increasing absorption of the incident electromagnetic radiation 114 increases a QE of the photodetector 108, thereby increasing performance of the image sensor 100.

Figure 2:
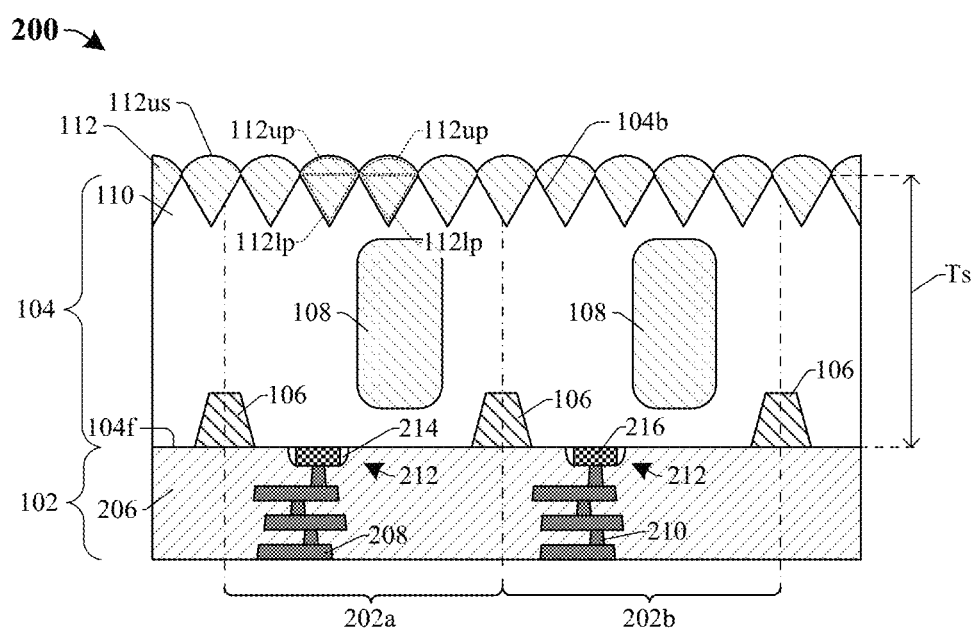
FIG. 2 illustrates a cross-sectional view of some alternative embodiments of the image sensor of FIG. 1, in which a plurality of semiconductor devices are disposed on a front-side surface of the substrate.

FIG. 2 illustrates a cross-sectional view of some embodiments of an image sensor 200 corresponding to an alternative embodiment of the image sensor 100 of FIG. 1.

In some embodiments, the image sensor 200 includes the substrate 104 overlying the interconnect structure 102. The image sensor 200 may be configured as a back-side illuminated CMOS image sensor (BSI-CIS). A plurality of semiconductor devices 212 are disposed within the interconnect structure 102 and along the front-side 104f of the substrate 104. In some embodiments, the semiconductor devices 212 may be configured as pixel devices that may output and/or process an electrical signal generated by photodetectors 108. The semiconductor devices 212 may, for example, be configured as transfer transistors, source-follower transistors, row select transistors, and/or reset transistors. It will be appreciated that the semiconductor devices 212 being configured as other semiconductor devices is also within the scope of the disclosure. Further, the semiconductor devices 212 may each comprise a gate structure 216 disposed along the front-side 104f of the substrate 104, and a sidewall spacer structure 214 disposed along sidewalls of the gate structure 216. In further embodiments, the gate structure 216 includes a gate dielectric layer and a gate electrode, where the gate dielectric layer is disposed between the substrate 104 and the gate electrode.

The interconnect structure 102 may include an interconnect dielectric structure 206, a plurality of conductive wires 208, and a plurality of conductive vias 210. In some embodiments, the interconnect dielectric structure 206 comprises one or more inter-level dielectric (ILD) layers that may respectively be or comprise an oxide, such as silicon dioxide, a fluorosilicate glass, a phosphate glass (e.g., borophosphate silicate glass), another suitable dielectric material, or any combination of the foregoing. It will be appreciated that the interconnect structure 206 comprising other suitable materials is also within the scope of the disclosure. The conductive wires and vias 208, 210 are disposed within the interconnect dielectric structure 206 and are configured to electrically couple devices disposed within the image sensor 200 to one another and/or to another integrated chip (not shown). In some embodiments, the conductive wires and/or vias 208, 210 may, for example, respectively be or comprise copper, aluminum, titanium nitride, tantalum nitride, tungsten, another conductive material, or any combination of the foregoing. It will be appreciated that the conductive wires and/or vias 208, 210 comprising other suitable materials is also within the scope of the disclosure.

In some embodiments, the substrate 104 may be any semiconductor body (e.g., bulk silicon, another suitable semiconductor material, or the like) and/or has a first doping type (e.g., p-type doping). Pixel regions 202a-b are laterally separated from one another by a plurality of isolation structures 106. In some embodiments, the plurality of isolation structures 106 may be configured as STI structures, DTI structures, back-side deep trench isolation (BDTI) structures, another suitable isolation structure, or any combination of the foregoing. In further embodiments, the isolation structures 106 may be or comprise silicon dioxide, silicon nitride, silicon carbide, or the like. Further, a photodetector 108 is disposed within each of the pixel regions 202a-b. The photodetectors 108 may, for example, comprise a second doping type (e.g., n-type doping) that is opposite the first doping type. It will be appreciated that the photodetector 108 and/or the substrate 104 comprising another doping type is also within the scope of the disclosure.

In some embodiments, the photodetectors 108 may be configured to generate electrical signals from near infrared (NIR) radiation that includes electromagnetic radiation within a first range of wavelengths. For example, the first range of wavelengths may be within a range of about 850 to 940 nanometers. It will be appreciated that other values for the first range of wavelengths are also within the scope of the disclosure. The substrate 104 has a thickness Ts that is defined between the front-side 104f of the substrate 104 and the back-side 104b of the substrate 104. In some embodiments, the thickness Ts is within a range of about 4 to 6 micrometers. It will be appreciated that other values for the thickness Ts are also within the scope of the disclosure. The thickness Ts of the substrate 104 is selected to ensure high QE for the first range of wavelengths. For example, if the thickness Ts of the substrate 104 is thin (e.g., less than about 4 micrometers), then the photodetectors 108 will have poor NIR light QE, which may decrease an ability for phase detection. Further, if the thickness Ts of the substrate 104 is thick (e.g., greater than about 6 micrometers), then placement of pixel devices such as contact regions, isolation structures, and/or transfer transistors may be adversely affected without, for example, an increase of QE for NIR light.

The back-side 104b of the substrate 104 comprises a plurality of protrusions 110 and a plurality of micro-lenses 112 are disposed between adjacent pairs of protrusions 110. The micro-lenses 112 each have a convex upper surface 112us configured to direct incident radiation towards underlying photodetectors 108, as illustrated and described in FIG. 1. This increases a QE of the photodetectors 108, thereby increasing a performance of the image sensor 200.

In further embodiments, the plurality of micro-lenses 112 may be configured as and/or referred to as a passivation layer that continuously laterally extends across the back-side 104b of the substrate 104. In such embodiments, the passivation layer overlies each protrusion 110 and comprises a plurality of upper convex protrusions 112up spaced laterally between adjacent pairs of the protrusions 110, and comprises a plurality of lower protrusions 1121p disposed below the upper convex protrusions 112up. The lower protrusions 1121p directly contact sidewalls of the protrusions 110. Further, in some embodiments, the passivation layer may continuously laterally extend across the protrusions 110 along an unbroken path.

Figure 3A:
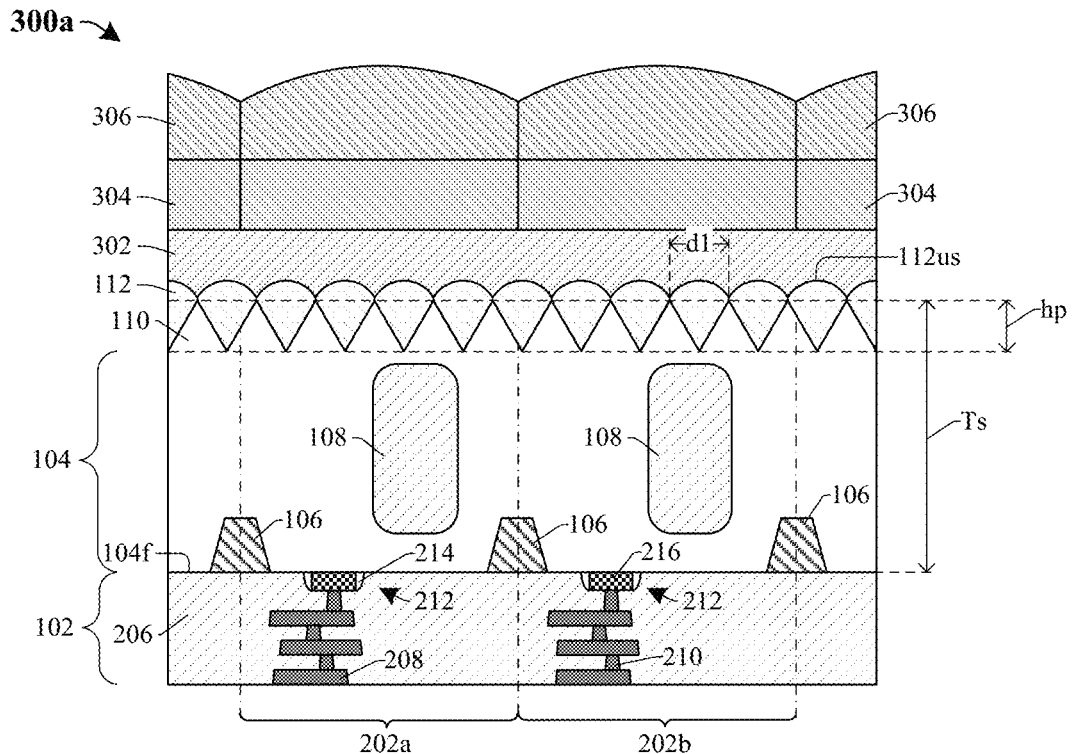
FIGS. 3A-B illustrate cross-sectional views of some alternative embodiments of the image sensor of FIG. 2, in which light filters overlie the plurality of micro-lenses.

FIG. 3A illustrates a cross-sectional view of some embodiments of an image sensor 300a corresponding to an alternative embodiment of the image sensor 200 of FIG. 2.

The image sensor 300a includes an upper dielectric layer 302 overlying the micro-lenses 112 and the back-side 104b of the substrate 104. In some embodiments, the upper dielectric layer 302 may, for example, be or comprise a plasma-enhanced oxide (PEOX) layer, silicon dioxide, or another suitable dielectric material. It will be appreciated that other suitable materials for the upper dielectric layer 302 are also within the scope of the disclosure. Further, a plurality of light filters 304 (e.g., color filters, infrared (IR) filters, etc.) overlie the upper dielectric layer 302. The plurality of light filters 304 are respectively configured to transmit specific wavelengths of incident radiation. For example, a first light filter may transmit radiation having wavelengths within a first range, while a second light filter, adjacent to the first light filter, may transmit radiation having wavelengths within a second range different than the first range. In other embodiments, the light filters 304 may be configured as, for example, color filters, where a first light filter is configured to transmit a first color (e.g., green light)

and an adjacent second light filter is configured to transmits a second color (e.g., blue light) different than the first color. Further, a plurality of upper lenses 306 are disposed over the plurality of light filters 304. Respective ones of the upper lenses 306 are laterally aligned with the light filters 304 and overlie the pixel regions 202a, 202b. The plurality of upper lenses 306 are configured to focus incident electromagnetic radiation towards the photodetectors 108, thereby further increasing the QE of the photodetectors and a performance of the image sensor 300a.

The photodetectors 108 are configured to generate electrical signals from electromagnetic radiation with a wavelength $\lambda$. In some embodiments, the wavelength $\lambda$ may include near infrared (NIR) radiation that includes electromagnetic radiation within a range of about 850 to 940 nanometers. It will be appreciated that other values for the wavelength $\lambda$ are also within the scope of the disclosure. In other embodiments, a height hp of the protrusions 110 may be greater than about $\lambda/2.5$, thereby increasing a light receiving surface area for incident electromagnetic radiation disposed upon the substrate 104. For example, the height hp may be greater than about 340 nanometers. It will be appreciated that other values for the height hp are also within the scope of the disclosure. This, in part, increases a sensitivity and/or QE of the image sensor 300a. A distance d1 is defined between top surfaces of two adjacent protrusions 110. In further embodiments, the distance d1 may be greater than about $\lambda/2$, thereby increasing a light receiving surface area for incident electromagnetic radiation disposed upon the substrate 104. For example, the distance d1 may be greater than about 425 nanometers. It will be appreciated that other values for the distance d1 are also within the scope of the disclosure. This, in part, further increases the sensitivity and/or QE of the image sensor 300a. By virtue of the height hp being greater than $\lambda/2.5$ and the distance d1 being greater than about $\lambda/2$, absorption of incident radiation with the wavelength $\lambda$ by the substrate 104 is increased while decreasing reflection of the incident radiation with the wavelength $\lambda$ away from the photodetectors 108. In some embodiments, the distance d1 is greater than the height hp.

Figure 3B:
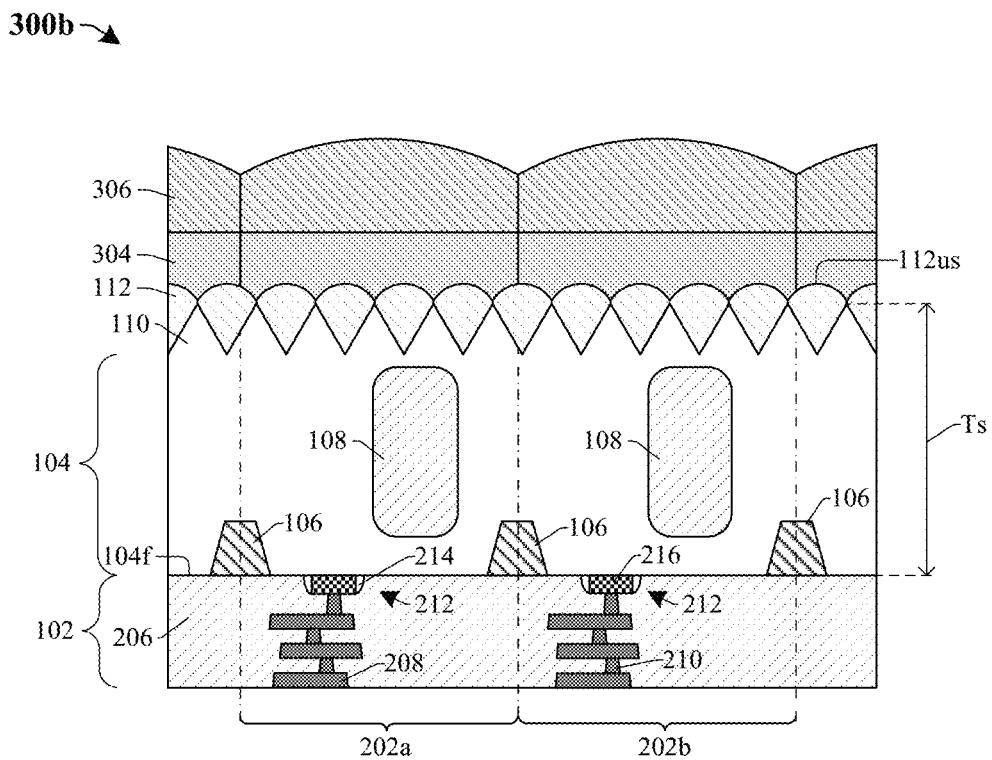

FIG. 3B illustrates a cross-sectional view of some embodiments of an image sensor 300b corresponding to some alternative embodiments of the image sensor 300a of FIG. 3A, where the upper dielectric layer 302 is omitted. In such embodiments, the plurality of light filters 304 directly contact the plurality of micro-lenses 112.

FIGS. 4-9 illustrate cross-sectional views 400-900 of some embodiments of a method of forming an image sensor that includes a substrate with a plurality of protrusions, and a plurality of micro-lenses disposed over and spaced between the protrusions according to the present disclosure. Although the cross-sectional views 400-900 shown in FIGS. 4-9 are described with reference to a method, it will be appreciated that the structures shown in FIGS. 4-9 are not limited to the method but rather may stand alone separate of the method. Furthermore, although FIGS. 4-9 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 4:
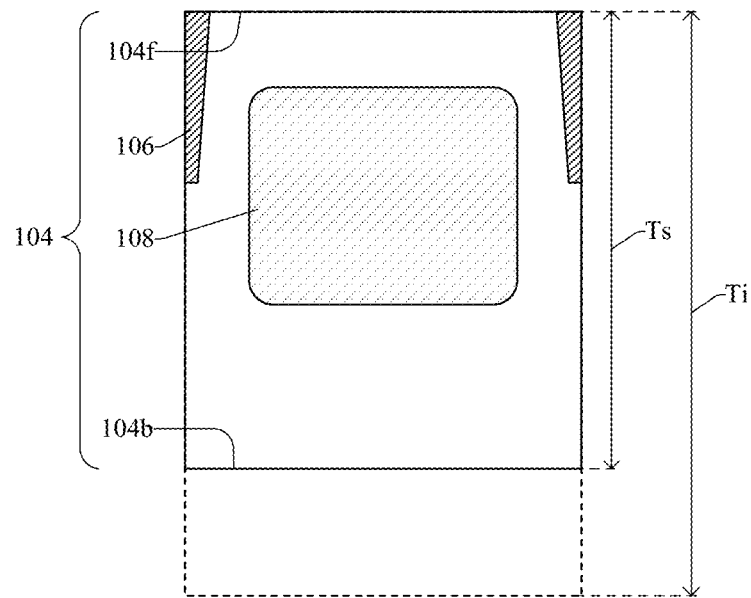
FIGS. 4-9 illustrate cross-sectional views of some embodiments of a method of forming an image sensor that includes a substrate with a plurality of protrusions, and a plurality of micro-lenses disposed over and spaced laterally between the protrusions.

As illustrated by the cross-sectional view 400 of FIG. 4, a substrate 104 is provided and an isolation structure 106 is formed on a front-side 104f of the substrate 104. In some embodiments, the substrate 104 may, for example, be a bulk substrate (e.g., a bulk silicon substrate), a silicon-on-insulator (SOI) substrate, or another suitable substrate. It will be appreciated that other materials for the substrate 104 are also within the scope of the disclosure. In some embodiments, before forming the isolation structure 106, a first implant process is performed to dope the substrate 104 with a first doping type (e.g., p-type). In some embodiments, a process for forming the isolation structure 106 may include: selectively etching the substrate 104 to form a trench in the substrate 104 that extends into the substrate 104 from the front-side 104f of the substrate 104; and filling (e.g., by chemical vapor deposition (CVD), atomic layer deposition (ALD), physical vapor deposition (PVD), thermal oxidation, etc.) the trench with a dielectric material (e.g., silicon nitride, silicon carbide, silicon dioxide, another suitable dielectric material, or any combination of the foregoing). In further embodiments, the substrate 104 is selectively etched by forming a masking layer (not shown) on the front-side 104f of the substrate 104, and subsequently exposing the substrate 104 to one or more etchants configured to selectively remove unmasked portions of the substrate 104.

Further, as shown in FIG. 4, a photodetector 108 is formed within the substrate 104. In some embodiments, the photodetector 108 includes a region of the substrate 104 comprising a second doping type (e.g., n-type) opposite the first doping type. In some embodiments, the photodetector 108 may be formed by a selective ion implantation process that utilizes a masking layer (not shown) on the front-side 104f of the substrate 104 to selectively implant ions into the substrate. In further embodiments, the first doping type comprises p-type dopants and the second doping type comprises n-type dopants, or vice versa. The photodetector 108 is configured to generate electrical signals from electromagnetic radiation with a wavelength $\lambda$. In some embodiments, the wavelength $\lambda$ may include near infrared (NIR) radiation that includes electromagnetic radiation within a range of about 850 to 940 nanometers. It will be appreciated that other values for the wavelength $\lambda$ are also within the scope of the disclosure.

In addition, as illustrated in FIG. 4, after forming the photodetector 108 a thinning process is performed on the back-side 104b of the substrate 104 to reduce an initial thickness Ti of the substrate 104 to a thickness Ts. The thickness Ts is defined between the front-side 104f of the substrate 104 and the back-side 104b of the substrate 104. In some embodiments, the thickness Ts is within a range of about 4 to 6 micrometers. It will be appreciated that other values for the thickness Ts are also within the scope of the disclosure. In some embodiments, the thinning process may include performing a mechanical grinding process, a chemical mechanical planarization (CMP) process, another suitable thinning process, or any combination of the foregoing.

Figure 5:
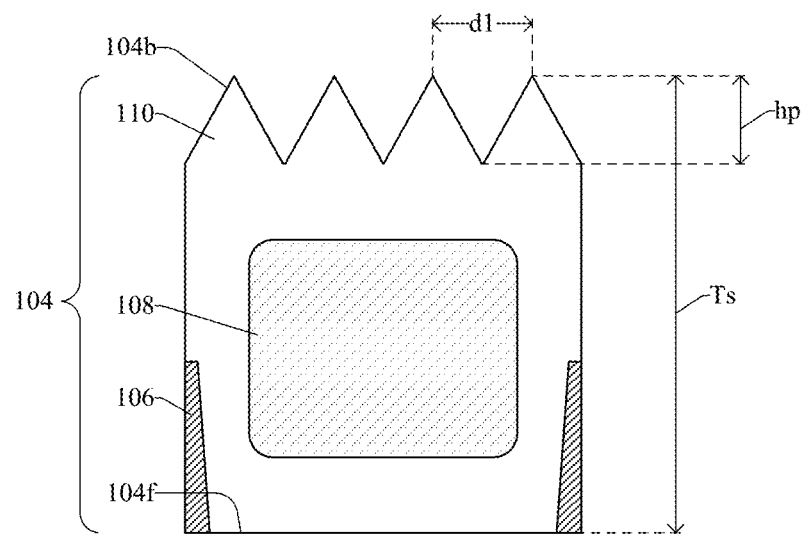

As illustrated by the cross-sectional view 500 of FIG. 5, the structure of FIG. 4 is flipped and subsequently patterned to define a plurality of protrusions 110 along the back-side 104b of the substrate 104. The back-side 104b of the substrate 104 is opposite the front-side 104f of the substrate 104. In some embodiments, the plurality of protrusions 110 are formed by performing one or more etch processes according to one or more masking layers (not shown). The one or more etch processes may, for example, include a wet etch process, a dry etch process, another suitable etch process, or any combination of the foregoing. Further, in some embodiments, the protrusions 110 are formed such that a height hp of the protrusions 110 may be greater than about $\lambda/2.5$, and a distance d1 may be greater than about $\lambda/2$, thereby increasing a light receiving surface area for incident electromagnetic radiation disposed upon the substrate 104.

The distance d1 is defined between top surfaces of two adjacent protrusions 110. In yet further embodiments, the height hp may be greater than about 340 nanometers and/or the distance d1 may be greater than about 425 nanometers. It will be appreciated that other values for the height hp and/or the distance d1 are also within the scope of the disclosure.

Figure 6:
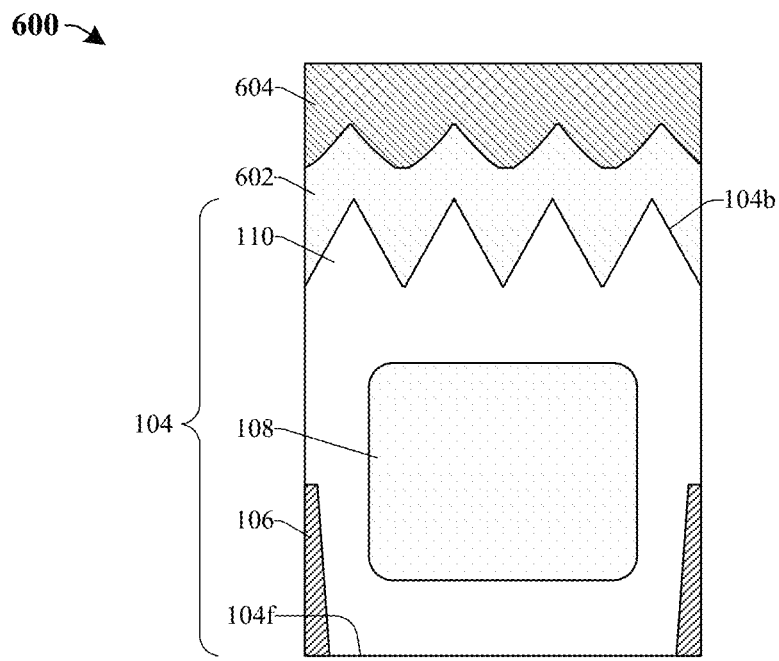

As illustrated by cross-sectional view 600 of FIG. 6, an upper dielectric layer 602 is deposited over the protrusions 110. An upper surface of the upper dielectric layer 602 may correspond to the shape of the protrusions 110. In some embodiments, the upper dielectric layer 602 may be deposited by, for example, CVD, ALD, PVD, thermal oxidation, a plasma enhanced deposition process (e.g., plasma-enhanced CVD (PECVD)), or another suitable deposition or growth process. Thus, the upper dielectric layer 602 may, for example, be or comprise a plasma enhanced oxide, silicon dioxide, silicon oxycarbide (SiOC), another suitable dielectric material, or any combination of the foregoing and/or may be formed to a thickness within a range of about 3,000 to 5,000 Angstroms. It will be appreciated that other values for the thickness of the upper dielectric layer 602 are also within the scope of the disclosure. In yet further embodiments, a bottom anti-reflective coating (BARC) layer 604 is formed over the upper dielectric layer 602. In some embodiments, the BARC layer 604 may, for example, be formed by CVD, ALD, PVD, or another suitable deposition or growth process. In yet further embodiments, the BARC layer 604 may, for example, be or comprise a high-k dielectric material (e.g., a dielectric material with a dielectric constant greater than 3.9), another suitable dielectric material, or any combination of the foregoing and/or may be formed to a thickness within a range of about 4,000 to 6,000 Angstroms. It will be appreciated that other values for the thickness of the BARC layer 604 are also within the scope of the disclosure. Thus, in some embodiments, the BARC layer 604 has a greater thickness than the upper dielectric layer 602.

Figure 7:
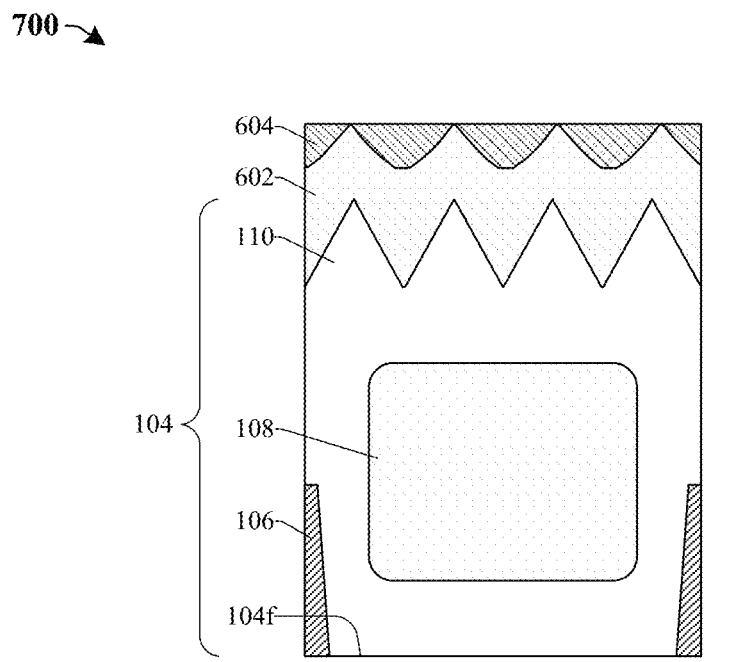

As illustrated by cross-sectional view 700 of FIG. 7, a first patterning process is performed on the BARC layer 604, thereby reducing an initial thickness of the BARC layer 604. In some embodiments, the first patterning process includes performing a dry etch process, a blanket dry etch process, or another suitable etch process. In further embodiments, the first patterning process may include exposing the BARC layer 604 to one or more etchants, such as oxygen (e.g., $O_2$), carbon monoxide (CO), another suitable etchant, or any combination of the foregoing. In yet further embodiments, the first patterning process does not etch the upper dielectric layer 602.

Figure 8A:
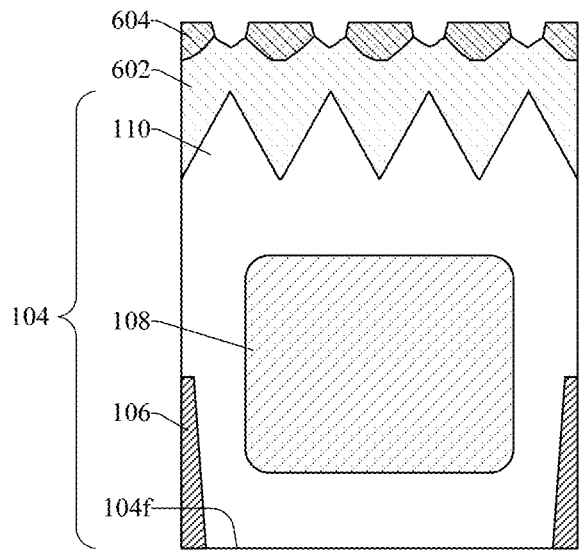
Figure 8B:
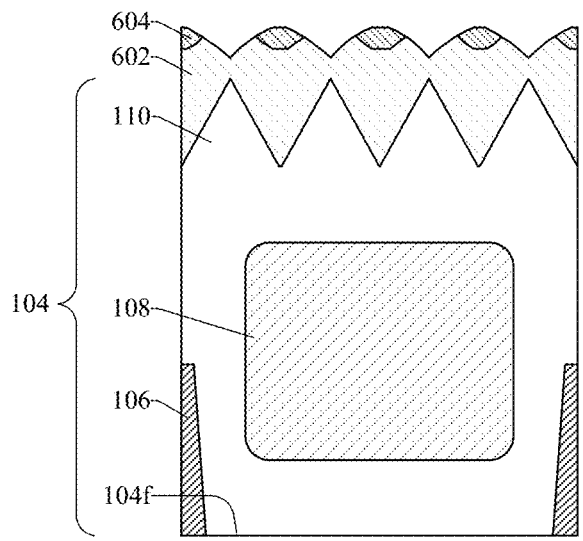
Figure 8C:
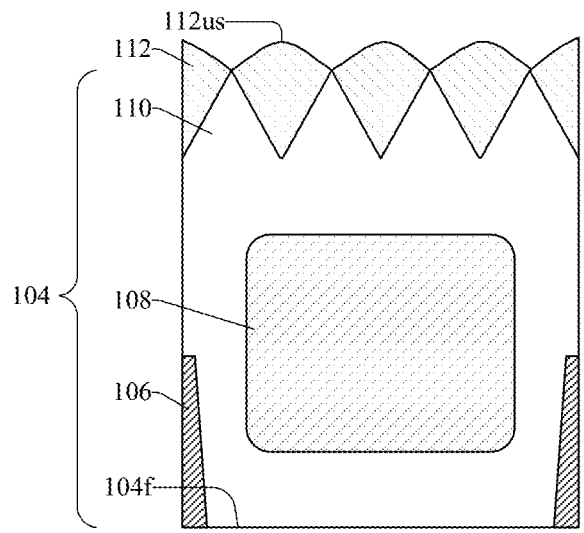

FIGS. 8A-8C illustrate cross-sectional views 800a-c corresponding to some embodiments of performing a second patterning process on the upper dielectric layer 602 and the BARC layer 604, thereby forming the micro-lenses 112. The second patterning process is performed in such a manner that the micro-lenses 112 each have a convex upper surface 112us overlying the protrusions 110. FIGS. 8A and 8B illustrate cross-sectional views 800a and 800b corresponding to some embodiments of a first snapshot and a second snapshot of the second patterning process. FIG. 8C illustrates a cross-sectional view 800c corresponding to some embodiments of the micro-lenses 112 after completing the second patterning process.

In some embodiments, the second patterning process includes performing a dry etch process, a blanket dry etch process, or another suitable etch process. In various embodiments, the second patterning process is performed solely by a blanket dry etch process. In further embodiments, the second patterning process may include exposing the upper dielectric layer 602 and the BARC layer 604 to one or more etchants, such as polymer rich etchants, octafluorocyclobutane (e.g., $C_4F_8$), trifluoromethane (e.g., $CHF_3$), another suitable etchant, or any combination of the foregoing. During the second patterning process, the upper dielectric layer 602 is etched at a first etch rate and the BARC layer 604 is etched at a second etch rate. In some embodiments, the first etch rate is at least 10 times greater than the second etch rate. In such embodiments, the second patterning process has a low selectivity for the BARC layer 604 relative to the upper dielectric layer 602, such that the upper dielectric layer 602 is etched more quickly (e.g., at least 10 times greater) than the BARC layer 604. This may be because the one or more etchants remove the upper dielectric layer 602 more quickly than the BARC layer 604. By virtue of the first etch rate being at least 10 times greater than the second etch rate, each of the micro-lenses 112 have a convex upper surface 112us. Thus, in some embodiments, a ratio of the first etch rate to the second etch rate is, for example, about 10:1, about 11:1, about 12:1, within a range of about 10:1 to 20:1, or greater than 10:1. It will be appreciated that other values for the ratio of the first etch rate to the second etch rate are also within the scope of the disclosure. The convex upper surfaces 112us of the micro-lenses 112 are each configured to bend and/or angle incident electromagnetic radiation towards a focal point underlying the corresponding convex upper surface 112us. This increases absorption of the incident electromagnetic radiation by the substrate 104 (e.g., by reducing a reflection of the incident electromagnetic radiation away from the substrate 104). Increasing absorption of the incident electromagnetic radiation increases a QE of the photodetector 108.

The cross-sectional view 800a of FIG. 8A illustrates some embodiments of a first snapshot of the second patterning process taken at a first time, where the upper dielectric layer 602 is removed more quickly than the BARC layer 604. Further, the cross-sectional view 800b of FIG. 8B illustrates some embodiments of a second snapshot of the second patterning process taken at a second time, where the second snapshot is taken at some time after the first snapshot. As illustrated by the FIG. 8B, remnants of BARC layer 604 are disposed along the top surface of the upper dielectric layer 602, such that an upper surface of the BARC layer 604 and the upper dielectric layer 602 laterally spaced between adjacent pairs of the protrusions 110 is curved and/or rounded outward in a direction away from the protrusions 110 (i.e., convex). The cross-sectional view 800c of FIG. 8C illustrates some embodiments of the micro-lenses 112 after performing the second patterning process on the upper dielectric layer 602 and the BARC layer 604. The convex upper surface 112us of each of the micro-lenses 112 corresponds to the curved upper surface of the BARC layer 604 and the upper dielectric layer 602 illustrated in FIG. 8B.

Figure 9:
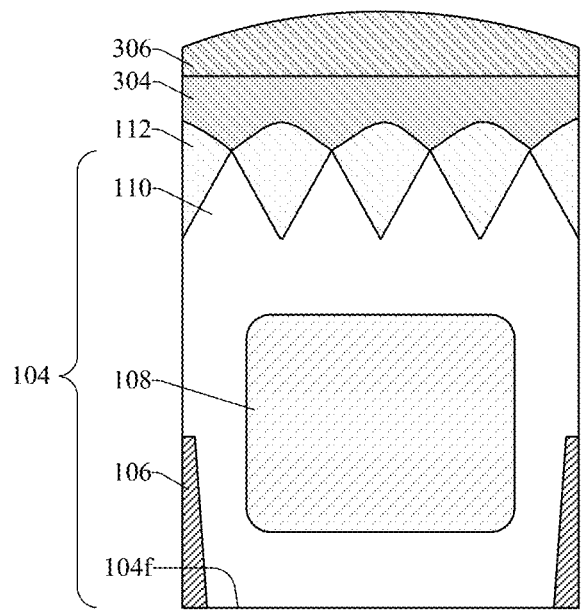

As illustrated by cross-sectional view 900 of FIG. 9, a light filter 304 is formed over the micro-lenses 112. The light filter 304 is formed of material that allows for the transmission of incident electromagnetic radiation (e.g., light) having a specific wavelength range, while blocking incident wavelength with another wavelength outside of the specified range. In further embodiments, the light filter 304 may be formed by CVD, PVD, ALD, sputtering, or the like and/or may be planarized (e.g., via a chemical mechanical planarization (CMP) process) subsequent to formation. Further, an upper lens 306 is formed over the light filter 304. In some embodiments, the upper lens 306 may be formed by depositing (e.g., by CVD, PVD, etc.) a lens material on the light filter 304. A lens template (not shown) having a curved upper surface is patterned above the lens material. The upper lens 306 is then formed by selectively etching the lens material according to the lens template.

Figure 10:
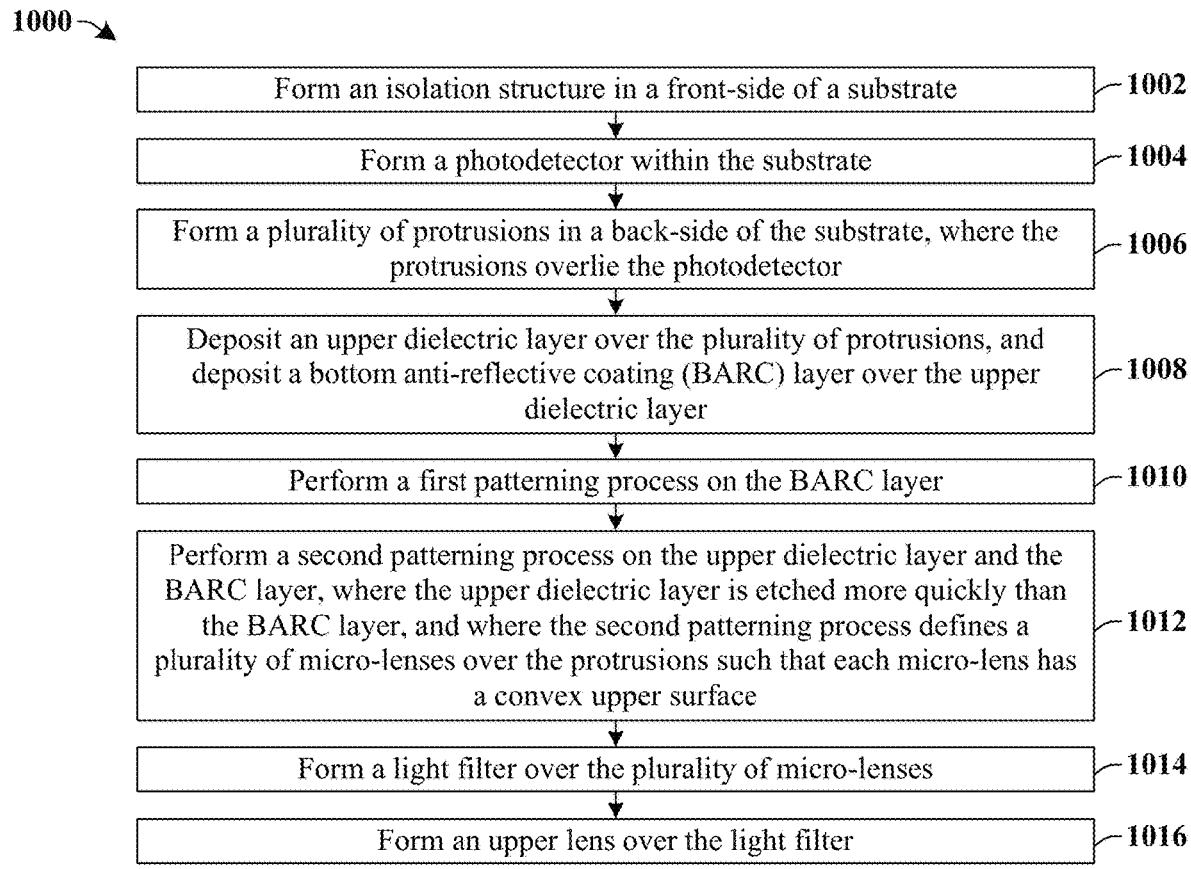
FIG. 10 illustrates a method in flow chart format that illustrates some embodiments of forming an image sensor that includes a substrate with a plurality of protrusions, and a plurality of micro-lenses disposed over and spaced laterally between the protrusions.

FIG. 10 illustrates a method 1000 of forming an image sensor that includes a substrate with a plurality of protrusions, and a plurality of micro-lenses disposed over and spaced between the protrusions in accordance with some embodiments of the present disclosure. Although the method 1000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1002, an isolation structure is formed in a front-side of a substrate. FIG. 4 illustrates a cross-sectional view 400 corresponding to some embodiments of act 1002.

At act 1004, a photodetector is formed within the substrate. FIG. 4 illustrates a cross-sectional view 400 corresponding to some embodiments of act 1004.

At act 1006, a plurality of protrusions are formed in a back-side of the substrate. The protrusions overlie the photodetector. FIG. 5 illustrates a cross-sectional view 500 corresponding to some embodiments of act 1006.

At act 1008, an upper dielectric layer is deposited over the plurality of protrusions. Further, a bottom anti-reflective coating (BARC) layer is deposited over the upper dielectric layer. FIG. 6 illustrates a cross-sectional view 600 corresponding to some embodiments of act 1008.

At act 1010, a first patterning process is performed on the BARC layer. FIG. 7 illustrates a cross-sectional view 700 corresponding to some embodiments of act 1010.

At act 1012, a second patterning process is performed on the upper dielectric layer and the BARC layer. The upper dielectric layer is etched more quickly than the BARC layer. Further, the second patterning process defines a plurality of micro-lenses over the protrusions such that each micro-lens has a convex upper surface. FIGS. 8A-8C illustrate cross-sectional views 800a-c corresponding to some embodiments of act 1012.

At act 1014, a light filter is formed over the plurality of micro-lenses. FIG. 9 illustrates a cross-sectional view 900 corresponding to some embodiments of act 1014.

At act 1016, an upper lens is formed over the light filter. FIG. 9 illustrates a cross-sectional view 900 corresponding to some embodiments of act 1014.

Accordingly, in some embodiments, the present disclosure relates to an image sensor including a substrate with a plurality of protrusions disposed along a back-side of the substrate. Further, a plurality of micro-lenses are disposed over and spaced laterally between the protrusions. The micro-lenses each comprise a convex upper surface configured to direct incident radiation to a focal point underlying the convex upper surface.

In some embodiments, the present application provides an image sensor, including: a substrate including a plurality of sidewalls that define a plurality of protrusions along a first side of the substrate, wherein the substrate has a first index of refraction; photodetector disposed within the substrate and underlying the plurality of protrusions; and a plurality of micro-lenses overlying the first side of the substrate, wherein the micro-lenses have a second index of refraction that is less than the first index of refraction, wherein the micro-lenses are respectively disposed laterally between and directly contact an adjacent pair of protrusions in the plurality of protrusions, and wherein the micro-lenses respectively comprise a convex upper surface.

In some embodiments, the present application provides an integrated chip, including: a substrate including a plurality of first protrusions along a back-side of the substrate, where the substrate comprises a first material with a first index of refraction; an interconnect structure disposed along a front-side of the substrate; a photodetector disposed within the substrate and underlying the plurality of first protrusions; a passivation layer arranged on and between the plurality of first protrusions, wherein the passivation layer includes a plurality of second protrusions along an upper surface of the passivation layer, wherein the plurality of second protrusions is different than the plurality of first protrusions, wherein the passivation layer comprises a second material with a second index of refraction different from the first index of refraction; and a light filter overlying the passivation layer.

In some embodiments, the present application provides a method for forming an image sensor, the method includes performing an ion implant process to define a photodetector within a substrate; etching a first side of the substrate to define a plurality of protrusions overlying the photodetector; depositing a dielectric layer over the plurality of protrusions, wherein the dielectric layer comprises a first material; depositing an anti-reflection coating (ARC) layer over the dielectric layer, wherein the ARC layer comprises a second material different than the first material; performing a first patterning process on the ARC layer; and performing a second patterning process on the dielectric layer and the ARC layer, thereby defining a plurality of micro-lenses that respectively have a concave upper surface, wherein the dielectric layer is etched at a first rate during the second patterning process and the ARC layer is etched at a second rate during the second patterning process, wherein the first rate is greater than the second rate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a substrate comprising a plurality of first protrusions along a back-side of the substrate, where the substrate comprises a first material with a first index of refraction;
an interconnect structure disposed along a front-side of the substrate;
a photodetector disposed within the substrate and underlying the plurality of first protrusions;
a passivation layer arranged on and between the plurality of first protrusions, wherein the passivation layer comprises a plurality of second protrusions along an upper surface of the passivation layer, wherein the plurality of second protrusions is different than the plurality of first protrusions, wherein the passivation layer comprises a second material with a second index of refraction different from the first index of refraction; and a light filter overlying the passivation layer.

2. The integrated chip of claim 1, wherein the first protrusions respectively have a triangular shape and the second protrusions respectively have a semicircular shape.

3. The integrated chip of claim 1, wherein a lower surface of the passivation layer comprises a plurality of third protrusions that engagedly meet a plurality of recesses spaced between the plurality of first protrusions of the substrate.

4. The integrated chip of claim 1, wherein the first index of refraction is at least two times greater than the second index of refraction.

5. The integrated chip of claim 1, wherein the photodetector is configured to generate electrical signals from near infrared (NIR) radiation.

6. The integrated chip of claim 5, wherein a thickness of the substrate is within a range of about 4 to 6 micrometers.

7. The integrated chip of claim 1, further comprising:
an upper lens overlying the light filter, wherein an upper surface of the upper lens is convex.

8. The integrated chip of claim 1, wherein a bottom surface of the light filter directly contacts the plurality of second protrusions.

9. An integrated chip, comprising:
a substrate comprising a plurality of sidewalls that define a plurality of protrusions along a first side of the substrate, wherein the substrate has a first index of refraction;
a photodetector disposed within the substrate and underlying the plurality of protrusions; and
a passivation layer overlying the first side of the substrate, wherein the passivation layer has a second index of refraction that is less than the first index of refraction, wherein the passivation layer comprises a plurality of micro-lenses, wherein the micro-lenses are respectively disposed laterally between and directly contact an adjacent pair of protrusions in the plurality of protrusions, and wherein the micro-lenses respectively comprise a convex upper surface.

10. The integrated chip of claim 9, wherein the plurality of protrusions are laterally separated from one another by recesses within the first side of the substrate, wherein the plurality of micro-lenses respectively comprise a lens protrusion that fills a corresponding recess.

11. The integrated chip of claim 9, wherein the substrate comprises silicon and the passivation layer comprises silicon dioxide.

12. The integrated chip of claim 9, wherein a height of the plurality of micro-lenses is greater than a height of the protrusions.

13. The integrated chip of claim 9, wherein the plurality of protrusions comprise a first protrusion and a second protrusion disposed laterally adjacent to one another, wherein the first protrusion comprises a first top point and the second protrusion comprises a second top point, wherein a height of the plurality of protrusions is less than a lateral distance between the first top point and the second top point.

14. The integrated chip of claim 13, wherein the plurality of micro-lenses comprises a first micro-lens disposed between the first and second protrusions, wherein a convex upper surface of the first micro-lens is spaced laterally between the first top point of the first protrusion and the second top point of the second protrusion.

15. The integrated chip of claim 14, wherein the first micro-lens is configured to direct incident electromagnetic radiation towards a focal point underlying the convex upper surface of the first micro-lens, wherein the focal point is spaced laterally between the first and second protrusions, and wherein the focal point is spaced vertically above a bottom surface of the plurality of protrusions.

16. An integrated chip, comprising:
a substrate comprising a plurality of first protrusions along a back-side of the substrate;
a plurality of photodetectors disposed within the substrate and underlying the plurality of first protrusions; and
a dielectric layer disposed on the back-side of the substrate, wherein the dielectric layer comprises a plurality of upper convex protrusions and a plurality of lower protrusions underlying the upper convex protrusions, wherein the lower protrusions directly contact adjacent protrusions in the first plurality of protrusions, wherein the first protrusions respectively have a first shape and the upper convex protrusions respectively have a second shape different than the first shape.

17. The integrated chip of claim 16, wherein the dielectric layer laterally extends across the plurality of first protrusions along an unbroken path.

18. The integrated chip of claim 16, wherein the lower protrusions respectively have the first shape.

19. The integrated chip of claim 16, wherein the upper convex protrusions and the lower protrusions are configured to directly light towards an underlying photodetector in the plurality of photodetectors.

20. The integrated chip of claim 16, wherein a width of a first photodetector in the plurality of photodetectors is greater than a width of a single upper convex protrusion in the plurality of upper convex protrusions.

* * * * *